(12) United States Patent
Chakraborty et al.

(10) Patent No.: US 7,999,283 B2
(45) Date of Patent: Aug. 16, 2011

(54) ENCAPSULANT WITH SCATTERER TO TAILOR SPATIAL EMISSION PATTERN AND COLOR UNIFORMITY IN LIGHT EMITTING DIODES

(75) Inventors: Arpan Chakraborty, Goleta, CA (US); Bernd Keller, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 576 days.

(21) Appl. No.: 11/818,818

(22) Filed: Jun. 14, 2007

(65) Prior Publication Data
US 2008/0308825 A1    Dec. 18, 2008

(51) Int. Cl.
*H01L 33/00* (2010.01)
(52) U.S. Cl. ............ 257/100; 257/13; 257/79; 257/98; 257/E51.02; 257/E51.022; 257/E33.001; 257/E33.059; 257/E33.074; 257/E25.028; 257/E25.032; 313/503; 313/512
(58) Field of Classification Search .................. 257/13, 257/79, 98, 100, E51.02, E51.002, E33.001, 257/E33.059, E33.074, E25.028, E25.032; 438/22, 25, 29, 35; 313/503, 512; 362/31; 359/599
See application file for complete search history.

(56) References Cited

U.S. PATENT DOCUMENTS

| | | | |
|---|---|---|---|
| 4,152,044 A | 5/1979 | Liu | |
| 4,675,575 A | 6/1987 | Smith | |
| 5,477,436 A | 12/1995 | Bertling et al. | |
| 5,959,316 A | 9/1999 | Lowery | 257/98 |
| 6,046,464 A | 4/2000 | Schetzina | |
| 6,330,111 B1 | 12/2001 | Myers | |
| 6,331,915 B1 | 12/2001 | Myers | |
| 6,657,393 B2 | 12/2003 | Natsume | |
| 6,746,889 B1 | 6/2004 | Eliashevich et al. | |
| 6,784,463 B2 | 8/2004 | Camras et al. | |
| 6,791,259 B1 | 9/2004 | Stokes et al. | |
| 6,870,311 B2 | 3/2005 | Mueller et al. | 313/491 |
| 6,932,497 B1 | 8/2005 | Huang | |
| 7,005,679 B2 | 2/2006 | Tarsa et al. | 257/89 |
| 7,083,490 B2 | 8/2006 | Mueller et al. | 445/24 |
| 7,087,936 B2 | 8/2006 | Negley | |
| 2002/0015013 A1 | 2/2002 | Ragle | |

(Continued)

FOREIGN PATENT DOCUMENTS
EP    0936682    8/1999
(Continued)

OTHER PUBLICATIONS

International Search Report for PCT/US2008/004453, Date: Sep. 9, 2008.

(Continued)

*Primary Examiner* — Benjamin P Sandvik
*Assistant Examiner* — Farid Khan
(74) *Attorney, Agent, or Firm* — Koppel, Patrick, Heybl & Philpott

(57) ABSTRACT

A light emitting device having an encapsulant with scattering features to tailor the spatial emission pattern and color temperature uniformity of the output profile. The encapsulant is formed with materials having light scattering properties. The concentration of these light scatterers is varied spatially within the encapsulant and/or on the surface of the encapsulant. The regions having a high density of scatterers are arranged in the encapsulant to interact with light entering the encapsulant over a desired range of source emission angles. By increasing the probability that light from a particular range of emission angles will experience at least one scattering event, both the intensity and color temperature profiles of the output light beam can be tuned.

16 Claims, 5 Drawing Sheets

U.S. PATENT DOCUMENTS

| | | | |
|---|---|---|---|
| 2002/0054495 A1 | 5/2002 | Natsume | |
| 2002/0180351 A1 | 12/2002 | McNulty et al. | |
| 2003/0015708 A1 | 1/2003 | Parikh et al. | |
| 2003/0085409 A1 | 5/2003 | Shen | |
| 2004/0207313 A1 | 10/2004 | Omoto et al. | |
| 2004/0217364 A1 | 11/2004 | Tarsa et al. | |
| 2005/0077535 A1 | 4/2005 | Li | |
| 2005/0117320 A1* | 6/2005 | Leu et al. | 362/31 |
| 2005/0152127 A1 | 7/2005 | Kamiya et al. | |
| 2005/0173692 A1 | 8/2005 | Park et al. | |
| 2005/0173728 A1 | 8/2005 | Saxler | |
| 2005/0224821 A1 | 10/2005 | Sakano et al. | |
| 2005/0224829 A1 | 10/2005 | Negley et al. | |
| 2006/0063289 A1 | 3/2006 | Negley et al. | |
| 2006/0081862 A1 | 4/2006 | Chua et al. | |
| 2006/0158899 A1 | 7/2006 | Avabe et al. | |
| 2006/0220046 A1* | 10/2006 | Yu et al. | 257/98 |
| 2007/0007558 A1* | 1/2007 | Mazzochette | 257/239 |
| 2007/0041101 A1 | 2/2007 | Goosey et al. | |
| 2007/0090383 A1 | 4/2007 | Ota et al. | |
| 2007/0268694 A1* | 11/2007 | Bailey et al. | 362/231 |
| 2008/0036364 A1 | 2/2008 | Li et al. | |
| 2008/0074032 A1 | 3/2008 | Yano et al. | |

FOREIGN PATENT DOCUMENTS

| | | |
|---|---|---|
| EP | 0936682 A | 8/1999 |
| EP | 1349202 A | 10/2003 |
| EP | 1653255 | 5/2006 |
| EP | 1681509 | 7/2006 |
| FR | 2586844 | 3/1987 |
| FR | 2759188 | 8/1998 |
| FR | 2814220 | 3/2002 |
| WO | WO 9856043 | 12/1998 |
| WO | WO 0211212 A | 2/2002 |
| WO | 03044870 | 5/2003 |
| WO | WO 03080763 | 10/2003 |
| WO | WO 2005104247 | 11/2005 |
| WO | WO 2007005844 A | 1/2007 |

OTHER PUBLICATIONS

Written Opinion for PCT/US2008/004453, Date: Sep. 9, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
Copending U.S. Appl. No. 11/443,741, date: Jun. 14, 2007.
Copending U.S. Appl. No. 11/685,761, date: Mar. 13, 2007.
Copending U.S. Appl. No. 11/939,059, date: Nov. 13, 2007.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
European Search Report from related European Application No. 07254498.4.
Notice Requesting Submission of Opinion re related Korean application No. 10-2004-7001033, dated: Mar. 9, 2009.
European Search Report re related EP Appl. 08160129.6.2222, Dated: Dec. 15, 2008.
Asbeck et al. "Enhancement of Base Conductivity Via the Piezoelectric Effect in AlGaN/GaN HBTs", Solid State Electronics, Elsevier Science Pub. Barking GB, vol. 44, No. 2, Feb. 1, 2000 pp. 211-219, XP004186190.
Office Action from U.S. Appl. No. 11/895,573, mailed: Jul. 23, 2009.
Response to Office Action from U.S. Appl. No. 11/895,573, filed Oct. 23, 2009.
Office Action from U.S. Appl. No. 11/895,573, mailed: Feb. 18, 2010.
Response to Office Action from U.S. Appl. No. 11/895,573, filed May 6, 2010.
Office Action from U.S. Appl. No. 11/895,573, mailed: May 19, 2010.
Response to Office Action from U.S. Appl. No. 11/895,573, filed Oct. 19, 2010.
Office Action from U.S. Appl. No. 11/895,573, mailed: Jan. 7, 2011.
Office Action from U.S. Appl. No. 12/151.089, mailed: Oct. 30, 2009.
Response to Office Action from U.S. Appl. No. 12/151,089, filed Feb. 1, 2010.
Office Action from U.S. Appl. No. 12/151,089. mailed: May 11, 2010.
Response to Office Action from U.S. Appl. No. 12/151,089, filed Oct. 11, 2010.
Invitation to Submit Applicant's Opinion (Summary) and Examiner's Report to the Board (Summary) in Japanese Appeal Filing No. 2009-007421, Japanese Patent Application No. 2003-529535 dated Dec. 7, 2010.
Office Action in German Patent Application No. 10 2008 029 318.0 dated Oct. 19, 2010.

* cited by examiner

US 7,999,283 B2

ENCAPSULANT WITH SCATTERER TO TAILOR SPATIAL EMISSION PATTERN AND COLOR UNIFORMITY IN LIGHT EMITTING DIODES

This invention was made with Government support under Contract No. USAF 05-2-5507. The Government has certain rights in this invention.

BACKGROUND OF THE INVENTION

1. Field of the Invention

The invention relates to light emitting devices and, more particularly, to white light emitting diodes and multi-colored light emitting device assemblies with a tuned spatial emission pattern and color temperature profile.

2. Description of the Related Art

Light emitting diodes (LED or LEDs) are solid state devices that convert electric energy to light, and generally comprise one or more active layers of semiconductor material sandwiched between oppositely doped layers. Typically, wire bonds are used to apply a bias across the doped layers, injecting holes and electrons into the active layer where they recombine to generate light. Light is emitted from the active layer and from all surfaces of the LED. A typical high efficiency LED comprises an LED chip mounted to an LED package and encapsulated by a transparent medium. The efficient extraction of light from LEDs is a major concern in the fabrication of high efficiency LEDs.

LEDs can be fabricated to emit light in various colors. However, conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the energy of some of the LED's blue light which increases the wavelength of the light, changing its color to yellow. Some of the blue light passes through the phosphor without being changed while a portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

It is noted that throughout the application reference is made to two different angles of interest. The first is the viewing angle which is shown as exemplary $\theta_v$ in FIG. 1a. The viewing angle is measured from the optic axis which in this case runs through the center of the hemispherical encapsulant and is perpendicular to the flat edge of the encapsulant. A viewing angle of zero degrees (0°) indicates that the output from the encapsulant is being viewed (or measured) from a point outside the encapsulant that is directly opposite the source, i.e., head-on. The viewing angle increases as the device is tilted with respect to the viewer. A viewing angle of ninety degrees (90°) indicates that the output is being measured from an angle that is perpendicular to the optic axis and even with the flat edge of the encapsulant, i.e., directly from the side.

The second angle that is referenced is the emission angle which is shown as $\theta_e$ in FIG. 1a. The emission angle shares the same optic axis with the viewing angle. It measures the angle from the optic axis at which a light ray initially propagates in the encapsulant after it is emitted from the source. A light ray that initially propagates from the source along the optic axis (e.g., ray $R_1$) has an emission angle of 0°. As shown ray $\theta_e$ is approximately forty degrees (40). The emission angle increases as the direction of initial propagation deviates from the optic axis. An important difference between the two angles is that the output profile at a given viewing angle is affected by scattering events inside the encapsulant, whereas the emission angle describes the direction of the light as it is initially emitted from the source before it can interact with materials within the encapsulant.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

A common type of LED packaging where a phosphor is introduced over an LED is known as a "glob-in-a-cup" method. An LED chip resides at the bottom of a cup-like recession, and a phosphor containing material (e.g. phosphor particles distributed in an encapsulant such as silicone or epoxy) is injected into and fills the cup, surrounding and encapsulating the LED. The encapsulant material is then cured to harden it around the LED. This packaging, however, can result in an LED package having significant variation of the color temperature of emitted light at different viewing angles with respect to the package. This color variation can be caused by a number of factors, including the different path lengths that light can travel through the conversion material. This problem can be made worse in packages where the phosphor containing matrix material extends above the "rim" of the cup in which the LED resides, resulting in a predominance of converted light emitted sideways into high viewing angles (e.g., at 90 degrees from the optic axis). The result is that the white light emitted by the LED package becomes non-uniform and can have bands or patches of light having different colors or intensities.

Another method for packaging or coating LEDs comprises direct coupling of phosphor particles onto the surfaces of the LED using methods such as electrophoretic deposition. This process uses electrostatic charge to attract phosphor particles to the surface of the LED chip that is charged. This method can result in improvement of the color uniformity as a function of viewing angle with one reason for this improvement being the source of the converted light and unconverted light being at close to the same point in space. For example, a blue emitting LED covered by a yellow converting material can provide a substantially uniform white light source because the converting material and LED are close to the same point in space. This method can present inconsistencies due to difficulties in controlling electrostatic charges across many LEDs in a mass production environment.

A known approach to addressing these inconsistencies to improve the spatial color temperature uniformity of the emitted light is to randomize the path of outgoing light rays using light scattering particles. FIGS. 1a and 1b illustrate a light emitting device 100 employing this approach. FIG. 1a represents a cross-section of the known device taken along section line 1a (shown in FIG. 1b). A light source 102 is disposed on a substrate 104. A layer of downconverting material 106 covers the light source 102. A reflector 108 is disposed around the light source 102 on the substrate 104 such that the light source 102 is housed in a cavity defined by the reflector 108 and the substrate 104. A hemispherical encapsulant 110 is disposed over the light source 102. The encapsulant 110 may be mounted over the light source 102 using an epoxy adhesive, for example, although other mounting methods may also be used. Light scattering particles 112 are disposed throughout the encapsulant 110.

Light rays R1-R4 model the paths of exemplary photons that are emitted from the source 102. As shown, R1 is emitted and passes through a length ($l_1$) of the downconverting material 106 where there is a probability that the light experiences a wavelength conversion. It is noted that the probability that a photon will be downconverted (i.e., absorbed and re-emitted) increases with the distance that the photon travels through the downconverting material 106. Thus, R2 which travels a greater distance ($l_2$) through the downconverting material 106 has a greater chance of being downconverted. It follows that, depending on the shape of the downconverting layer, the percentage of light that experiences a downconversion upon passing through the downconverting layer 106 is a function of the angle of emission from the source 102. Without light scattering particles, the emission spectrum would exhibit a pronounced pattern, producing a light spot with variances in color temperature and intensity often noticeable to the human eye. Such non-uniformities can render a light emitting device undesirable for certain applications.

After passing through the downconverting material 106, the light enters the encapsulant 110. The light scattering particles 112 distributed throughout the encapsulant 110 are designed to redirect the individual photons before they are emitted to randomize the point where the photons exit the encapsulant 110. This has the effect of improving spatial color temperature uniformity. For example, R1 collides with a light scattering particle 112, changes direction, and is emitted as shown. R1 exits the encapsulant 110 at a different point than it would have if no scattering particles were present. R3 experiences multiple scattering events. R2 and R4 pass through the encapsulant unimpeded. Thus, the light scattering particles randomize (to a certain degree) the point at which emitted photons exit the encapsulant 110 by disassociating the photons from their initial emission angle.

SUMMARY OF THE INVENTION

One embodiment of a light emitting device according to the present invention comprises at least one light emitter. An encapsulant is arranged above the emitter such that substantially all light that is emitted from the emitter passes through the encapsulant. The encapsulant has light scattering properties that vary spatially in relation to the emission angle of light propagating through the encapsulant.

Another embodiment of a light emitting device according to the present invention comprises at least one emitter disposed on a surface. An encapsulant is disposed above the emitter(s) such that substantially all of the light emitted from the device passes through the encapsulant. The encapsulant has multiple three-dimensional (3-D) regions with associated concentrations of light scattering particles. The 3-D regions are arranged within the encapsulant to modify the output intensity and color temperature profile of the light emitting device.

One embodiment of a method of tuning the output profile of light emitted from a source according to the present invention comprises providing an encapsulant proximate to the source such that substantially all of the emitted light passes through the encapsulant. The light emitted from said source is redirected using selectively arranged clusters of light scattering elements within the encapsulant and along the surface of the encapsulant. The light is emitted from the encapsulant with an output profile that is determined by the selective arrangement of the clusters and the location of the modified surface of the encapsulant.

One embodiment of an encapsulant according to the present invention comprises a first material defining the shape of the encapsulant. The first material has a first refractive index. A second material having a particulate characteristic is dispersed within the first material such that the second material has a non-uniform density throughout the first material. The second material has a second refractive index.

One embodiment of a method of fabricating an encapsulant comprises providing a mold for shaping the encapsulant. An amount of a first material having particular light scattering properties is introduced into the mold. Additional materials having particular light scattering properties are introduced into the mold in a sequence such that the encapsulant comprises distinct regions, each of the regions having particular light scattering properties.

DETAILED DESCRIPTION OF THE INVENTION

Figure 1A:
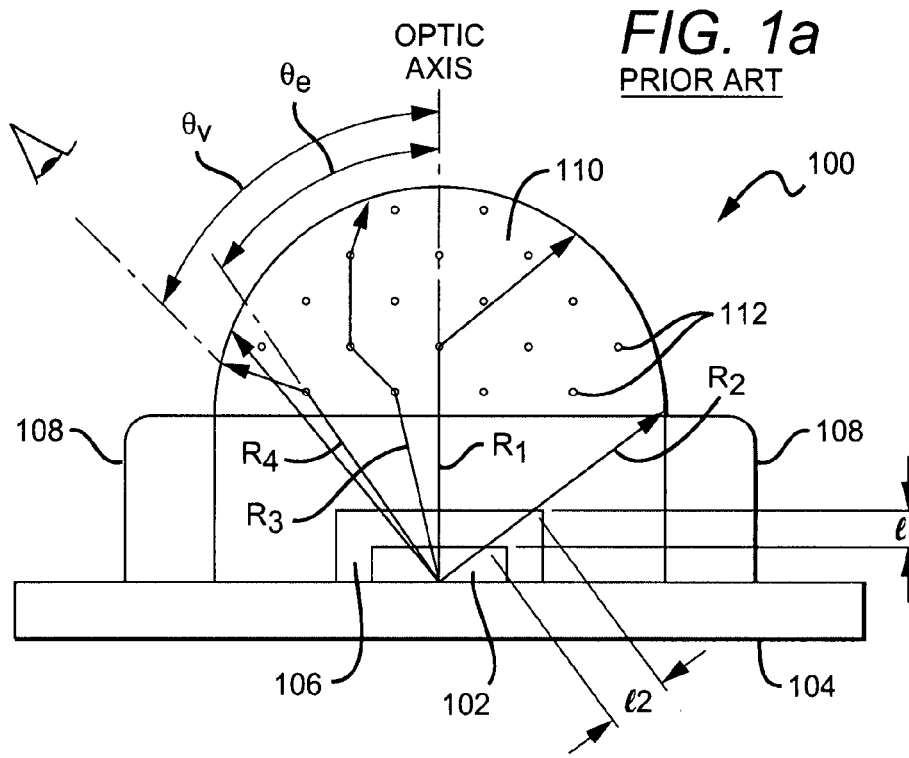
FIG. 1a is a cross-sectional representation of a known light emitting device.
Figure 1B:
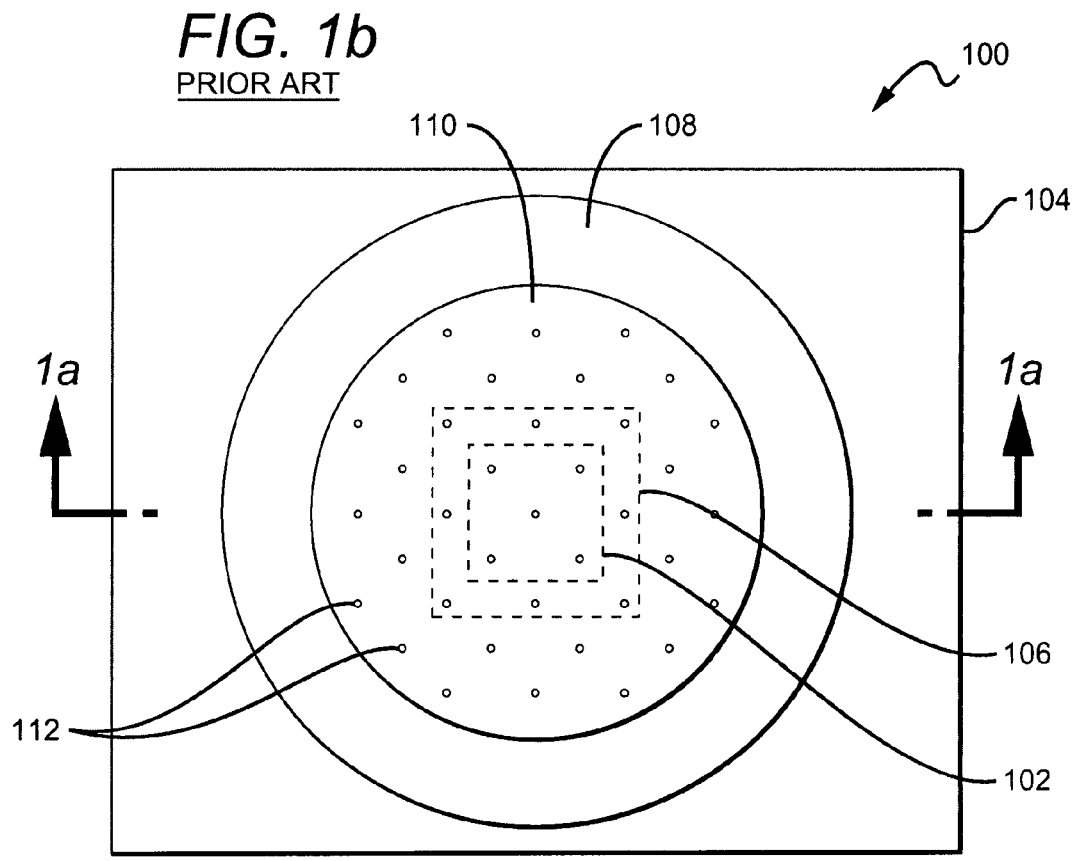
FIG. 1b is a top-side plan view of a known light emitting device.

The present invention provides an improved light emitting device and methods for fabricating the device wherein the emission intensity and color temperature profiles can be tuned using materials that have light scattering properties by arranging the materials in various configurations in an encapsulant around an emitter. The new devices and method work particularly well with solid state light sources, such as light emitting diodes (LEDs). Similarly as in other LED devices, a bias voltage is applied across the device and light is emitted as a result of radiative recombination in the active region of the device. It is often desirable to engineer the output of an LED, sometimes referred to as the light spot. Some applications require a light spot with a high degree of color temperature uniformity and a wide emission profile.

Two attributes of the light output profile that can be manipulated using the present invention are the color temperature and the intensity profile as a function of the viewing angle. Other attributes may be manipulated as well. An encapsulant element is disposed above the light source such that substantially all of the light emitted from the source has to pass through it. The encapsulant can also be disposed such that the encapsulant and the light source are mounted to a common surface. The encapsulant may comprise any structure that is disposed above the source as described above and in one embodiment according to the present invention the encapsulant can comprise a lens used alone or in combination with other bonding materials to mount the lens over the source. The encapsulant can be made of silicone, epoxy, glass, plastic or other materials and may perform functions such as beam shaping, collimating, and focusing, etc. The encapsulant may be formed in place over the source, or it may be fabricated separately and then subsequently attached to the light source by an adhesive epoxy, for example. By varying the light scattering properties spatially within the encapsulant, a percentage of the light emitted from a source over a range of emission angles can be redirected to create a desired output profile. Emission angles and viewing angles are discussed above. Some exemplary configurations of encapsulants are discussed in detail below.

Although there are several structures that can be used to scatter light inside the encapsulant, two light scattering structures that are particularly well-suited to the present invention are scattering particles and surface modifications. By varying the density of the light scattering particles within the encapsulant to create highly concentrated regions of particles, the light from the source can be redirected to achieve a particular output profile.

Another way to redirect light is to modify selected areas of the encapsulant surface. The surface can be modified by several known methods such as etching or grinding, for example, as discussed in detail below. Light approaching a modified portion of the encapsulant surface (as opposed to an unmodified portion) has a higher probability of being redirected and exiting the encapsulant at another point. Thus, by modifying specific regions of the surface the output profile can be tailored to specification. Combinations of scattering particles within the encapsulant and modifications to the surface of the encapsulant can also be effective.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogenous layer of material. A single "layer" may contain various scattering material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein but are to include deviations in shapes that result, for example, from manufacturing. A region illustrated or described as rectangular, for example, will typically have rounded or curved features due to normal manufacturing tolerances. Thus, the regions illustrated in the figures are schematic in nature and their shapes are not intended to illustrate the precise shape of a region or particle and are not intended to limit the scope of the invention.

Figure 2:
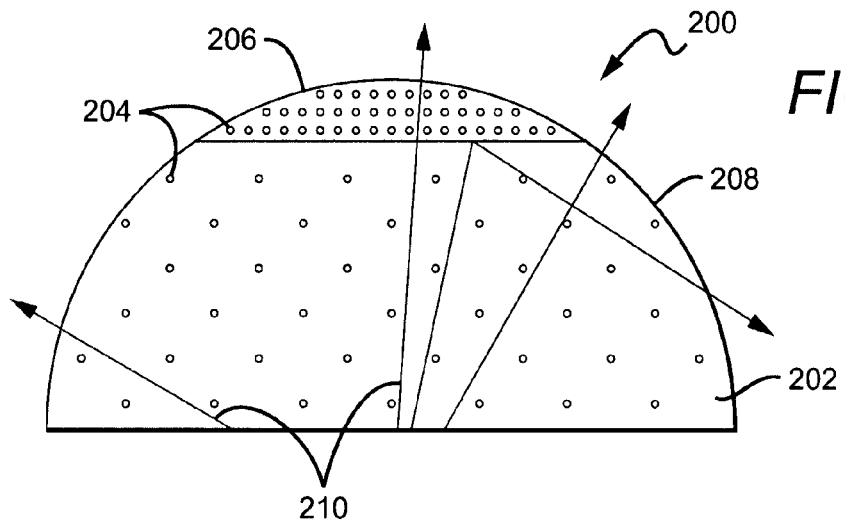
FIG. 2 is a cross-sectional representation of an embodiment of an encapsulant according to the present invention.

FIG. 2 shows an embodiment of an encapsulant 200 according to the present invention. The encapsulant 200 typically comprises at least two different materials. A medium 202 gives the encapsulant 200 shape. A preferred shape for the encapsulant 200 is a hemisphere having a curved surface and a flat surface. However, many other encapsulant shapes can also be used such as a flat shape or planoconvex, for example. The medium 202 comprises thermally or optically curable materials, such as transparent epoxy or silicone, for example. Light scattering particles 204 are distributed throughout the medium 202.

Scattering particles 204 can comprise many different materials, including:
  silica gel;
  zinc oxide (ZnO);
  yttrium oxide ($Y_2O_3$);
  titanium dioxide ($TiO_2$);
  barium sulfate ($BaSO_4$);
  alumina ($Al_2O_3$);
  fused silica ($SiO_2$);
  fumed silica ($SiO_2$);
  aluminum nitride;
  glass beads;
  zirconium dioxide ($ZrO_2$);
  silicon carbide (SiC);
  tantalum oxide ($TaO_5$);
  silicon nitride ($Si_3N_4$);
  niobium oxide ($Nb_2O_5$); or
  boron nitride (BN).

$TiO_2$, $Al_2O_3$, and silica are preferred materials. Materials other than those listed may also be used. These scattering particles 204 should have a high index of refraction relative to the surrounding medium 202, creating a large index of refraction differential between the materials. Because the index differential causes refraction it would also be possible to use a scattering particle material that has a low index of refraction relative to the surrounding medium 202. The diameter of the scattering particles 204 is typically less than a micrometer, although larger particles can be used. The particles 204 create localized non-uniformities in the medium 202 that force the light to deviate from a straight path.

When the light strikes one or more of the scattering particles 204 the index of refraction differential between the medium 202 and the particle 202 causes the light to refract and travel in a different direction. A large index of refraction differential yields a more drastic direction change for an incident photon. For this reason, materials with a high index of refraction work well in mediums such as silicone or epoxy. Another consideration when choosing a light scattering material is the optical absorbance of the material. Large particles back-scatter more of the light inside the package before it can escape the encapsulant 200, decreasing the total luminous output of the device. Thus, preferred scattering particle materials have a high index of refraction relative to the medium (e.g., $TiO_2$ in epoxy) and a particle size comparable to the wavelength of the light propagating through the encapsulant 200 (e.g., 1 µm particles for the visible spectrum). This ensures maximum forward or sideways scattering effect while minimizing light loss due to back-scattering.

A single photon may experience several scattering events before it is emitted from the encapsulant into the ambient. When a photon passes into a region with a high density of scattering particles, it may be refracted many times in many directions, making it less probable that the photon will exit the encapsulant from a region with a high concentration of scattering particles. By varying the concentration of light scattering particles throughout the medium 202, the color temperature and intensity profiles of the output light can be tailored.

Various concentration levels of scattering particles can be used as dictated by the application for which the device is designed. Using $TiO_2$ scattering particles, for example, a high density region can include approximately 0.1% scattering particles by volume while the surrounding medium can comprise 0.02% scattering particles by volume. Thus, the high density region in this example has five times as many scattering particles per unit volume as the surrounding medium. The exemplary density ratio is 5:1 (high density region:low density region). Other densities and density ratios can be used; however, the loss due to absorption increases with the density of the scattering particles. Thus, in the example above the density of the $TiO_2$ scattering particles in the surrounding medium should not exceed 0.05% in order to maintain an acceptable loss figure. Densities and density ratios can vary according to the materials selected for the scattering particles and the surrounding medium.

High density regions can be specifically arranged within the encapsulant to achieve various output profiles by affecting the probability that light emitted from the source at a specific angle will exit the encapsulant 200 at a given point. More specifically as discussed above, because the color temperature of the light is a function of the viewing angle, the angular color temperature profile can be controlled. And because it is less likely that light, regardless of color, will pass through a high density region and exit the encapsulant 200, the angular intensity profile can also be tuned. Other factors may also influence the disposition of high density regions throughout the encapsulant 200. Encapsulant 200 can be arranged to cooperate with a light emitting device similar to the device shown in FIG. 1a.

Referring again to FIG. 2, region 206 has a high concentration of scattering particles 204 relative to the adjacent region 208. Region 206 represents a three-dimensional (3-D) space, occupying a volume at the tip of the substantially hemispherical encapsulant 200. Light rays 208 are shown emanating from a source (not shown) positioned at a distance beneath the encapsulant 200.

For ease of reference, light entering the encapsulant 200 at emission angles having an absolute value less than approximately 30° is referred to as low angle light. Light having an emission angle with an absolute value greater than approximately 30° and less than approximately 60° is termed mid-range angle light. Light with an emission angle having an absolute value of greater than approximately 60° is referred to as high angle light. The ranges given are only meant to convey a general sense of the emission angle of incident light and should not be construed to limit the light associated with one of the descriptive terms to a strict range of emission angles.

The light rays 208 enter at the flat surface of the encapsulant 200 as shown. In this particular embodiment, low angle light will likely collide with the high density region 206. A higher percentage of the low angle light that is incident on region 206 will experience scattering events than will light that only passes through the adjacent region 208. A reduced percentage of the light incident on region 206 will pass directly through the region 206. Using this particular geometry, the light that is emitted from region 206 will exhibit better color temperature uniformity owing to an increased number of scattering events and a reduced intensity due to light that is redirected away from the region 206, exiting the encapsulant from the adjacent region 208.

In this embodiment, the volume of the high density tip region 206 can be determined according to the viewing angle range of the output profile that is to be manipulated. A larger volume of high density material will affect the output profile over a broader range of viewing angles. For example, if the design requires an altered output profile over the viewing angle range of −45° to 45°, a specific volume of high density material is needed to fill the tip region 206. Because the geometry is relatively simple in this embodiment the following simple equation can be used to find the necessary volume of high density material, where R is the radius of the substantially hemispherical encapsulant and θ is the emission angle:

$$V = \pi \cdot R^3 \cdot \left[\cos\theta - \frac{\cos^3\theta}{3} - \frac{2}{3}\right]$$

Figure 3:
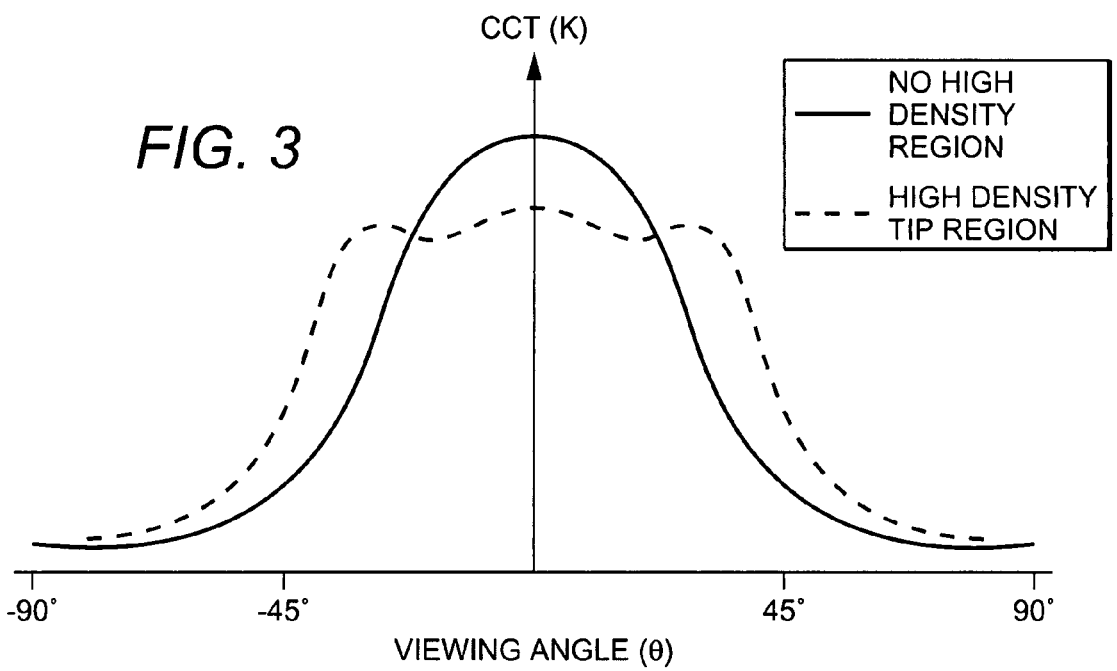
FIG. 3 is a graph modeling an exemplary correlated color temperature output profile from a light emitting device with a high density region according to the present invention and a similar device without a high density region.

In this embodiment, the high density tip region 206 causes a noticeable decrease in both the output intensity and correlated color temperature (CCT) over the range of viewing angles where the view is obscured by the tip region 206. This has the effect of flattening out the output profile graph over the specified angle range as shown in FIG. 3. FIG. 3 is only meant to provide an example of a typical output profile using the tip region embodiment. The graph does not reflect actual experimental results.

Figure 4:
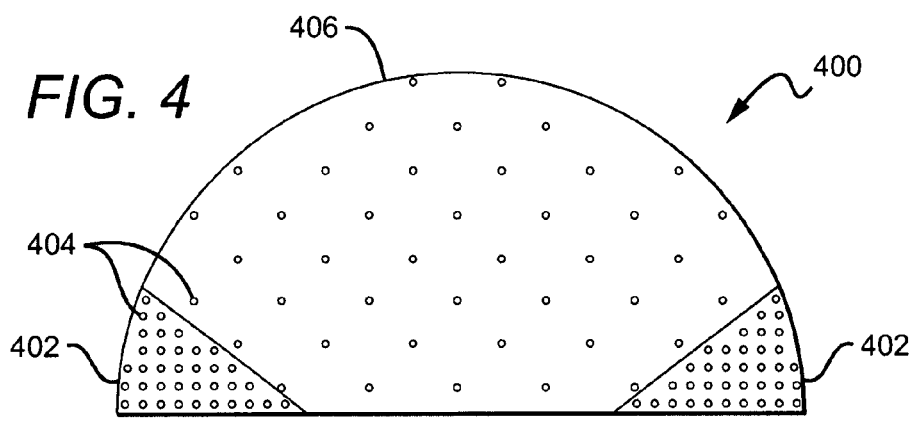
FIG. 4 is a cross-sectional representation of an embodiment of an encapsulant according to the present invention.

FIG. 4 shows a cross-sectional representation of another embodiment of an encapsulant 400 according to the present invention. The encapsulant 400 can be formed similarly as discussed above, using the same or different materials. Here, region 402 has a high concentration of scattering particles 404 relative to the adjacent region 406 and is disposed near the flat surface of the encapsulant 200 that is closest to the light source (not shown). FIG. 4 shows the high density region 402 having wedge-shaped features. In 3-D, the region 402 resembles a truncated inverse cone structure.

One result of the configuration described in FIG. 4 is that light can be redirected away from the high angles back toward the center of the encapsulant 400. The high density region 406 has the effect of redistributing some of the intensity that would normally be measured at high viewing angles to the lower viewing angles. This embodiment of the encapsulant 400 appears brighter when viewed at lower viewing angles (e.g., when viewed head on). Thus, the high density region 402 can be used to shape the intensity profile of the beam. The color temperature uniformity at high viewing angles is already good, so the high density region 402 has little effect on the color temperature profile at high viewing angles.

The wedge-shaped features 402 are disposed to define a space where low angle light can pass into the low density region 406 without first interacting with the high density region 402. The distance between the vertices of the wedge-shaped features 402 may be adjusted to increase or decrease the size of the space that the light passes through to reach the low density region 406.

Figure 5:
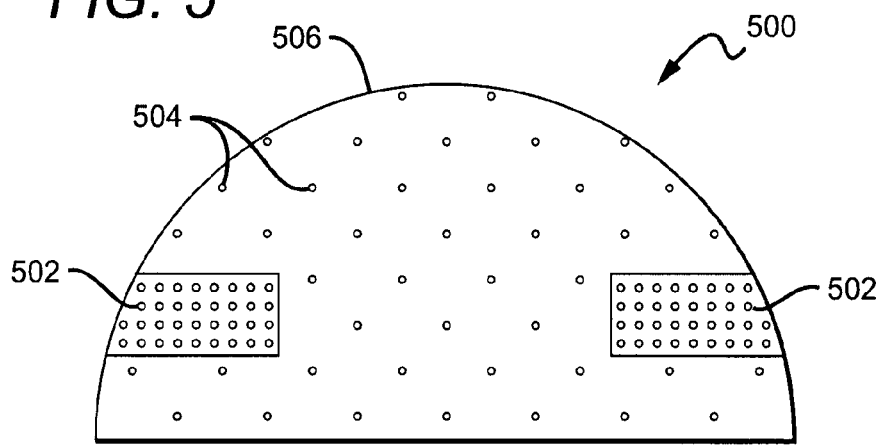
FIG. 5 is a cross-sectional representation of an embodiment of an encapsulant according to the present invention.

FIG. 5 shows a cross-sectional representation of another embodiment of an encapsulant 500 according to the present invention. Region 502 has a higher concentration of light scattering particles 504 than the adjacent region 506. In 3-D the high density region 502 is substantially toroidal. Thus the region 502 forms a ring around the perimeter of the encapsulant 500 with a hole in the middle. In this embodiment, light having emission angles in the higher or lower range passes through the encapsulant without interacting with the high density region 502. Light with a mid-range emission angle (e.g., θ>40° or θ<50°) will be incident on the high density region 502. Thus, the output profile is affected more drastically at the mid-range viewing angles. The width of the region 502 and the size of the hole can be chosen such that light emitted from a specific range of intermediate angles interacts with the high density region 502.

Figure 6:
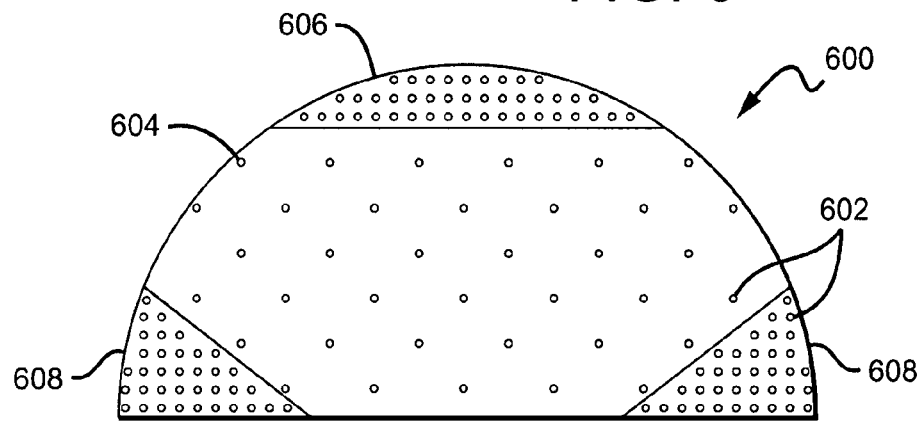
FIG. 6 is a cross-sectional representation of an embodiment of an encapsulant according to the present invention.

FIG. 6 shows a cross-sectional representation of an encapsulant 600 according to the present invention. The encapsulant 600 incorporates more than one region having a higher concentration of scattering particles 602 than the adjacent region 604. Tip region 606 and base region 608 are both high density regions. This particular embodiment allows light from mid-range emission angles to pass through the encapsulant 600 with less probability of interacting with the high density regions 606, 608. The high density region 608 functions to redirect light back towards the optic axis, shaping the intensity profile of the beam and redirecting light toward the high density region 606. The high density region 606 functions to improve the color uniformity and the intensity distribution of light at low viewing angles. Although this embodiment shows a particular combination of region geometries, many different combinations are possible depending on the desired output profile. The combinations are only meant to be exemplary. Thus, the invention should not be limited by these examples.

Figure 7:
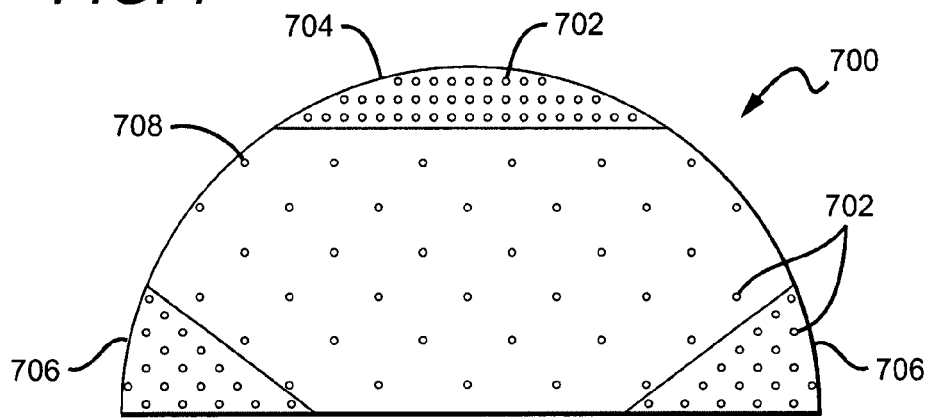
FIG. 7 is a cross-sectional representation of an embodiment of an encapsulant according to the present invention.

FIG. 7 shows a cross-sectional representation of an encapsulant 700 according to the present invention. The encapsulant 700 features multiple high density regions, each of those regions having a different concentration of light scattering particles 702. Tip region 704 has the highest density of light scattering particles 702; the base region 706 is less dense than the tip region 704 but more dense than region 708. Densities can be chosen to affect light emitted from discrete ranges of emission angles differently. A denser region will result in an output profile at an associated range of viewing angles that is less intense with improved color temperature uniformity over some viewing angle ranges.

Figure 8:
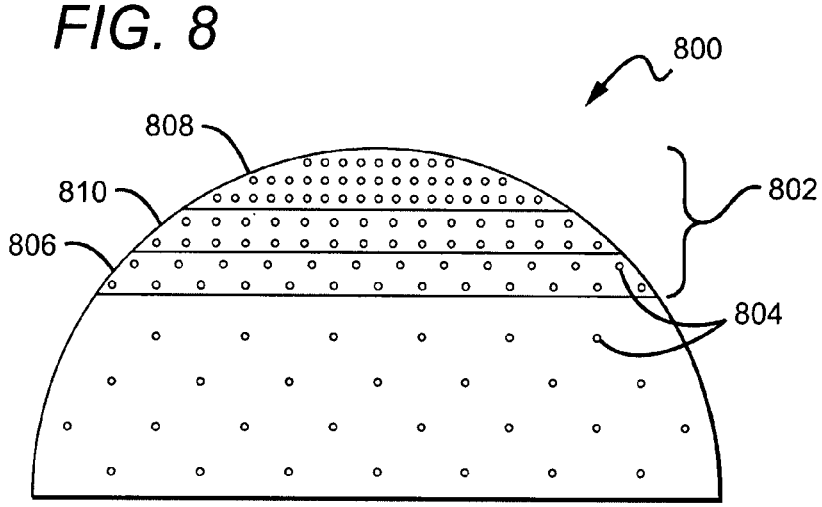
FIG. 8 is a cross-sectional representation of an embodiment of an encapsulant according to the present invention.

FIG. 8 shows a cross-sectional representation of an embodiment of an encapsulant 800 according to the present invention. The encapsulant 800 features a range of scattering particle densities in the gradated tip region 802. The scattering particles 804 are disposed in a gradient with the least dense sub-region 806 closest to the source and the densest sub-region 808 at the tip. A sub-region 810 with an intermediate density is interposed between. The sub-regions 806, 808, 810 are shown as discrete layers with homogenous scattering particle densities within. However, the gradated region may be a continuum with a smooth transition from low to high density. Also, the densest sub-region may be disposed closest to the source (not shown). The gradated tip region 802 affects the output profile in a more continuous and smooth fashion over the desired range of viewing angles, eliminating noticeable intensity and color temperature variations.

One method for fabricating a device with gradated scattering particle regions involves a sequential molding process. In the case of an embodiment having a hemispherical encapsulant such as encapsulant 800, a hemispherical mold can be used to form the encapsulant 800. An amount of a first material having a particular concentration of light scattering particles is introduced into the mold. The first material, which in this embodiment will constitute the tip region, can be allowed to harden or set before adding the next layer, or the process can continue without hardening. Then, an amount of a second material having a different concentration of light scattering particles is introduced into the mold on top of the first material. The second material may be allowed to set before adding additional layers, but the process can continue before hardening of the previously disposed layers. Additional layers having various thicknesses and concentrations of light scattering particles can be subsequently introduced into the mold. Thus, a sequenced molding process can be used to fabricate an encapsulant such as the one shown in FIG. 8. Many different mold shapes and material sequences may be used to fabricate a desired encapsulant.

Figure 9:
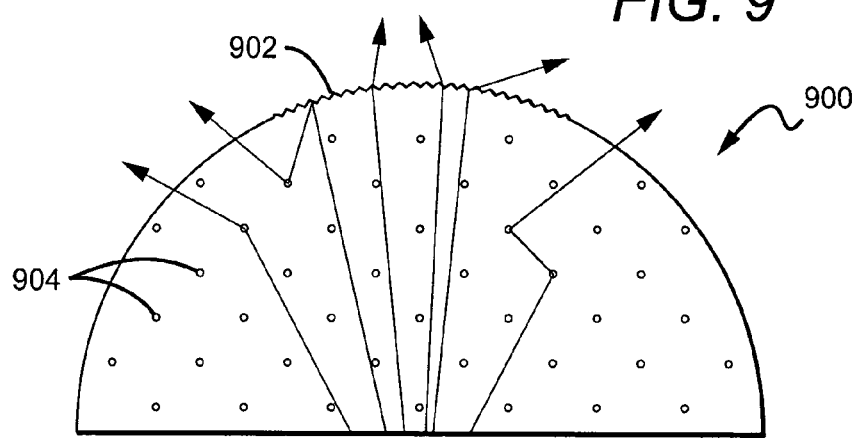
FIG. 9 is a cross-sectional representation of an embodiment of an encapsulant according to the present invention.

FIG. 9 shows a cross-sectional representation of an embodiment of an encapsulant 900 according to the present invention. The encapsulant 900 features a modified surface 902 and scattering particles 904. Similarly as with other scattering materials, the modified surface 902 scatters the photons of light, preventing them from exiting the encapsulant 900 from the same angle at which they were emitted from the source (not shown). This has the effect of randomizing the portion of the emitted light that is incident on the modified surface 902. Light that strikes the modified surface 902 has a higher probability of being emitted at an altered angle or being redirected back inside the encapsulant 900. Thus, the intensity and the color temperature profile can be tuned by modifying a particular portion of the surface.

In this embodiment, the uniformly dense scattering particles 904 have a general scattering effect, whereas the modified surface has a concentrated effect on the output profile over a specific range of viewing angles. Here, the modified surface 902 is disposed at the tip of the encapsulant 900. Light that is emitted at low angles is more likely to strike the modified surface 902. Because the color temperature is a function of the emission angle, a specific range of viewing angles can be targeted for improved color temperature uniformity.

There are several different known methods for modifying a surface. Portions of the surface may be etched, cut, or ground, for example. Other methods of roughening a surface may also be used. A surface may be randomly modified, or it can be specifically textured to provide a more ordered modification. Known methods of texturing can be used to provide many different specific geometric structures on a modified surface such as truncated pyramids, for example. The degree to which the surface will scatter incident light depends on the roughness of the surface. Roughness can be measured as the average distance from peak to valley of the surface contour. As surface roughness increases, the percentage of scattered light also increases. If, for example, the surface is being roughened using a chemical etch (e.g., an HF-based etchant) the roughness of the surface can be tuned by varying the etch time. A longer etch time will typically result in a higher degree of surface roughness. In this way, the surface roughness can be controlled to achieve a particular average level of scattering.

Figure 10:
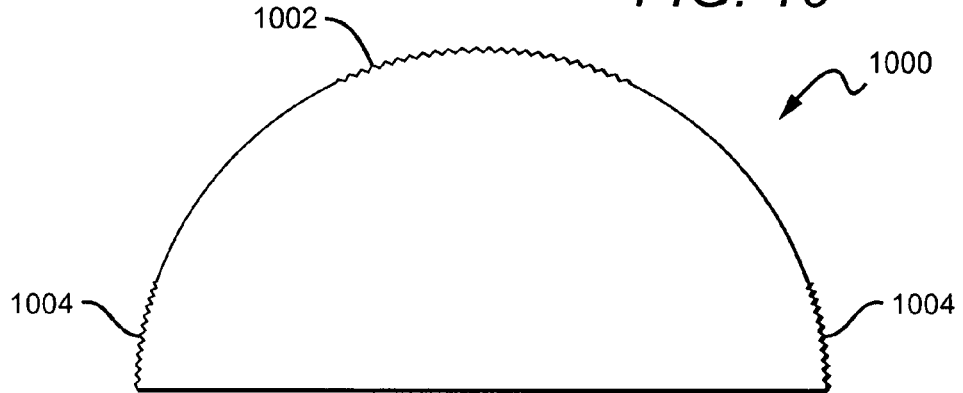
FIG. 10 is a cross-sectional representation of an embodiment of an encapsulant according to the present invention.

FIG. 10 shows a cross-sectional representation of an embodiment of an encapsulant 1000 according to the present invention. The encapsulant 1000 features multiple modified surfaces 1002, 1004. Similarly as with high density scattering particle regions, light from various emission angle ranges can be manipulated to yield a specific output profile. In this embodiment light from both low angles and high angles will be redirected internally at a higher percentage than light emitted at an intermediate angle. The light emitted from these surfaces 1002, 1004 will also exhibit a more uniform color temperature distribution, although the effect will be more noticeable at lower viewing angles where the color temperature non-uniformity is at a maximum. By selecting certain areas of the encapsulant 1000 surface to modify, the output intensity profile can be specifically tuned. FIG. 10 is an exemplary embodiment of a combination of modified surface regions. However, many other modified surface geometries can also be used to achieve tailored output profiles.

Figure 11:
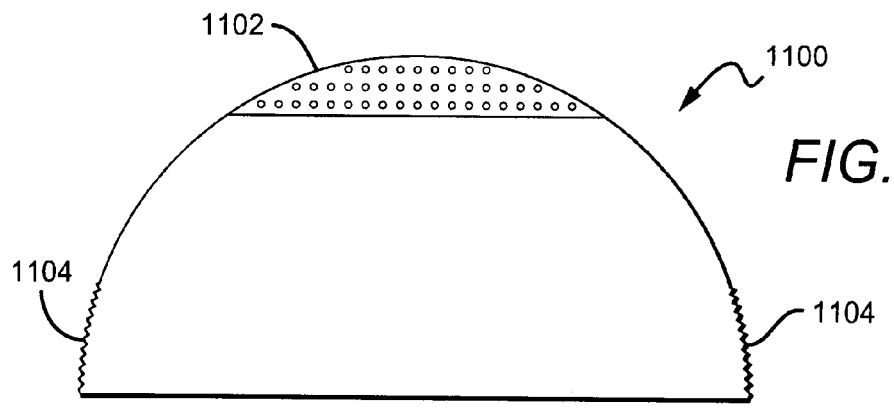
FIG. 11 is a cross-sectional representation of an embodiment of an encapsulant according to the present invention.

FIG. 11 shows a cross-sectional representation of an embodiment of an encapsulant 1100 according to the present invention. The encapsulant features a combination of a high density scattering particle region 1102 and a modified surface 1104. This particular exemplary embodiment would affect the output profile with respect to light that is emitted from both low and high angles. The high density region 1102 is arranged to interact with the light that is emitted from the source at low angles. The modified surface 1104 is disposed to alter the profile of light emitted from the source at high angles and to redirect high angle light back into the encapsulant 1100 and towards region 1102. Although both high density regions and modified surfaces have a similar effect on light that interacts with them, there may be differences in the output profiles resulting from the two different structures. The combination may provide advantages due to the manner and the different degree to which the structures interact with the light. Using both kinds of structures in a single encapsulant can provide additional design options to yield a highly specific output profile. Many variations on the combination arrangement are possible. For example, a high density region can be used to modify the profile of light emitted from mid-range angles while a modified surface interacts with the light emitted at low angles. The invention is not limited to any particular combination or arrangement.

Figure 12:
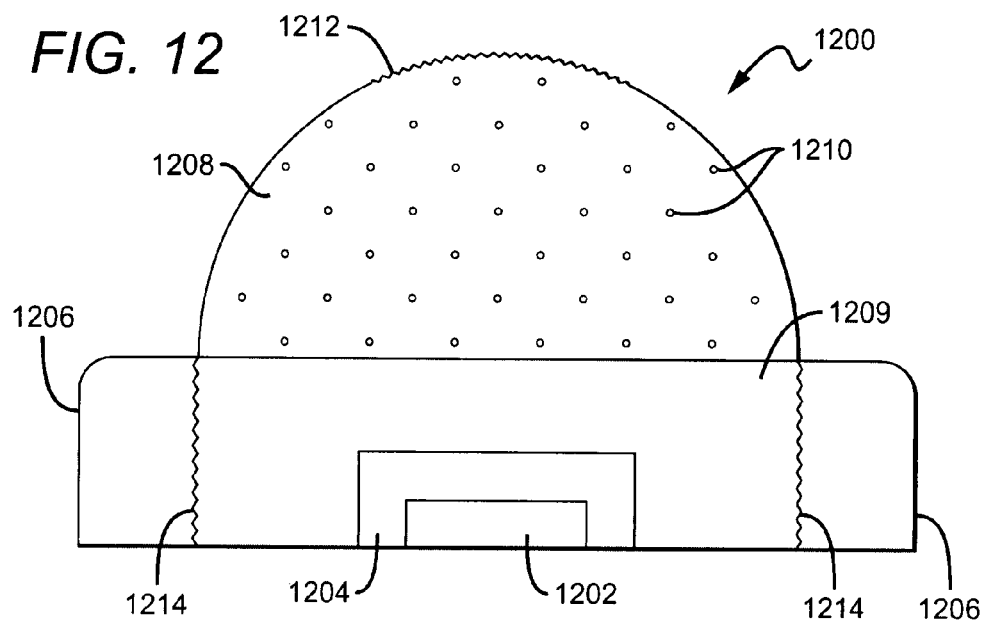
FIG. 12 is a cross-sectional representation of an embodiment of a light emitting device according to the present invention.

FIG. 12 shows a cross-sectional representation of an embodiment of a light emitting device 1200. A light source 1202 such as an LED, for example, is disposed on a surface with the source's primary emission surface covered by a layer of wavelength conversion material 1204. A ring-shaped reflector element 1206 is disposed on the surface and surrounds the source 1202. The reflector element 1206 may be made of a reflective material such as aluminum, for example, or it may have a diffusive or reflective coating on its inner wall that faces the source 1202. The reflective element 1206 redirects light that is emitted from the source 1202 at very high angles.

An encapsulant 1208 is disposed above the source 1202 such that substantially all of the light that is emitted must pass through the encapsulant 1208 before it escapes into the ambient. Although the encapsulant 1208 can be many shapes, a preferred shape is a hemisphere. Light scattering particles 1210 are distributed throughout the light transmitting encapsulant 1208. The encapsulant 1208 may be mounted above the source 1202 using a light transmitting filler material 1209. The filler material 1209 is preferably high temperature polymer with high light transmissivity and a refractive index that matches or closely matches the refractive index of the encapsulant 1208, which may be made from glass, quartz, high temperature and transparent plastic, silicone, epoxy resin or a combination of these materials. The encapsulant 1208 can be placed on top of and adheres to the filler material 1209. In an alternative embodiment, the encapsulant may be formed such that the encapsulant and the light source are mounted to a common surface with no filler material in between.

In this particular embodiment, the encapsulant comprises a modified surface 1212. The modified surface 1212 is arranged at the tip of the encapsulant 1208, interacting with light emitted from the source 1202 at low angles (i.e., along the optic axis). The reflector element 1206 also comprises a modified surface 1214 that runs along the inner wall, facing toward the source 1202. The surface 1214 may be modified similarly as discussed above with respect to modified surfaces of an encapsulant. For example, the surface may be roughened/textured by etching, cutting or grinding. Other methods of surface modification may also be used. Although not shown in FIG. 12, it is also possible to modify the flat surface of the encapsulant 1200 that faces the source 1202. The modified surface 1214 randomizes the direction of high angle light before it passes into the encapsulant 1208 above. This helps to eliminate the color temperature pattern caused by wavelength conversion material as discussed above. The modified surface 1214 works in addition to the scattering particles 1210 and the modified encapsulant surface 1212. The modified surface 1214 can be used in combination with any other light scattering structures to achieve a tailored output profile.

Figure 13:
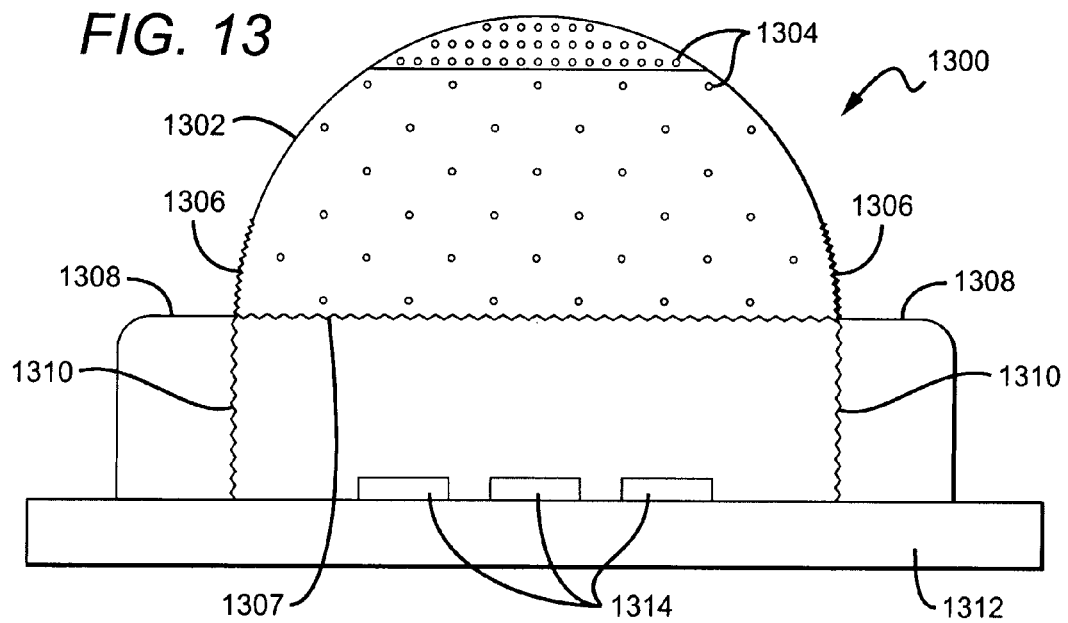
FIG. 13 is a cross-sectional representation of an embodiment of a light emitting device according to the present invention.

FIG. 13 shows a cross-sectional representation of an embodiment of a light emitting device 1300 according to the present invention. The device 1300 is similar to the device shown in FIG. 12 and has many of the same features. The device 1300 comprises several light scattering elements. An encapsulant 1302 has light scattering particles distributed within it, some of which are concentrated in a high density region 1304 at the tip of the encapsulant 1302. The device 1300 features modified encapsulant surfaces 1306, 1307. A reflector element 1308 also has a modified surface 1310.

The reflector element 1308 is mounted on a surface 1312 along with a plurality of light sources 1314. The light sources 1314 can be the same color or different colors, monochromatic or white. In a preferred embodiment, three light sources are mounted to the surface 1312: a red source, a green source, and a blue source. The light sources 1314 may be mounted in a variety of configurations on the surface 1308. The scattering elements can be arranged within the device such that light from some or all of the sources 1314 can be manipulated to achieve a desired output profile.

Although the present invention has been described in detail with reference to certain preferred configurations thereof, other versions are possible. Therefore, the spirit and scope of the invention should not be limited to the versions described above.

We claim:
1. A light emitting device, comprising:
at least one light emitter; and
an encapsulant arranged such that light that is emitted from said at least one emitter passes through said encapsulant, said encapsulant having light scattering properties that vary spatially in relation to the emission angle of light propagating through said encapsulant, wherein said encapsulant comprises multiple three-dimensional (3-D) regions containing light scattering particles, said 3-D regions arranged within said encapsulant to tune the intensity profile of the light emitted from said at least one light emitter as a function of the viewing angle.

2. The light emitting device of claim 1, wherein said light scattering particles comprise one or more material from the group of titanium dioxide ($TiO_2$), alumina ($Al_2O_3$), and fumed silica ($SiO_2$).

3. The light emitting device of claim 1, wherein at least one of said regions contains a higher concentration of said light scattering particles relative to the other of said regions.

4. The light emitting device of claim 3, wherein said encapsulant has a bisecting cross-section, said cross-section showing a tip area disposed distal to said at least one light emitter, said tip area defining one of said 3-D regions having a high concentration of light scattering particles relative to an adjacent region.

5. The light emitting device of claim 3, said encapsulant comprising multiple 3-D regions having a high concentration of light scattering particles relative to the other of said regions.

6. The light emitting device of claim 1, wherein one or more portions of the surface of said encapsulant are modified to scatter emitted light incident on said surface.

7. The light emitting device of claim 6, wherein a portion of the surface of said encapsulant is modified to scatter emitted light incident on said surface.

8. The light emitting device of claim 1, further comprising a layer of wavelength conversion material surrounding the exposed portions of said at least one light emitter.

9. The light emitting device of claim 1, further comprising a reflector element disposed on said substrate, said reflector having a substantially toroidal shape with said encapsulant and said at least one emitter arranged in the center, said reflector element comprising inner walls to redirect light from said at least one emitter toward said encapsulant.

10. The light emitting device of claim 9, wherein said reflector element inner walls are modified to scatter incident light.

11. The light emitting device of claim 1, wherein said at least one emitter comprises a plurality of emitters.

12. A light emitting device, comprising:
at least one emitter disposed on a surface; and
an encapsulant disposed above said emitter such that light emitted from said device passes through said encapsulant, said encapsulant having multiple three-dimensional (3-D) regions with associated concentrations of light scattering particles, said 3-D regions arranged within said encapsulant to modify the output intensity and color temperature profiles of said light emitting device,
wherein said 3-D regions are arranged within said encapsulant to tune the intensity profile of the emitted light as a function of the viewing angles.

13. The light emitting device of claim 12, wherein said 3-D regions are arranged within said encapsulant to improve the color uniformity of the emitted light over a range of viewing angles.

14. The light emitting device of claim 12, wherein said encapsulant comprises a 3-D region having a high concentration of light scattering particles relative to an adjacent region, said 3-D region disposed at the tip of said encapsulant opposite said at least one emitter.

15. The light emitting device of claim 12, further comprising a plurality of emitters disposed on said surface.

16. The light emitting device of claim 11, wherein said plurality of emitters emit at least two different colors of light.

* * * * *